(12) United States Patent
Juschicz et al.

(10) Patent No.: US 12,007,416 B2
(45) Date of Patent: Jun. 11, 2024

(54) MEASURING DEVICE ASSEMBLY

(71) Applicant: GREENWOOD-POWER GMBH, Rohrau (AT)

(72) Inventors: Norbert Juschicz, Petronell-Carnuntum (AT); Willibald Bacher, Theresienfeld (AT)

(73) Assignee: GREENWOOD-POWER GMBH, Rohrau (AT)

( * ) Notice: Subject to any disclaimer, the term of this patent is extended or adjusted under 35 U.S.C. 154(b) by 0 days.

(21) Appl. No.: 18/252,349

(22) PCT Filed: Nov. 8, 2021

(86) PCT No.: PCT/AT2021/060415
§ 371 (c)(1),
(2) Date: May 9, 2023

(87) PCT Pub. No.: WO2022/094646
PCT Pub. Date: May 12, 2022

(65) Prior Publication Data
US 2023/0408555 A1    Dec. 21, 2023

(30) Foreign Application Priority Data

Nov. 9, 2020  (AT) ............................... A 50961/2020

(51) Int. Cl.
*G01R 19/00*    (2006.01)
(52) U.S. Cl.
CPC ................................ *G01R 19/0084* (2013.01)

(58) Field of Classification Search
CPC . G01R 19/00; G01R 19/0084; G01R 19/0092
(Continued)

(56) References Cited

U.S. PATENT DOCUMENTS

| | | |
|---|---|---|
| 2006/0022683 A1 | 2/2006 | Johnson et al. |
| 2009/0124130 A1 | 5/2009 | Hughes et al. |
| 2020/0064376 A1 | 2/2020 | Loyd et al. |

FOREIGN PATENT DOCUMENTS

| | | |
|---|---|---|
| CN | 105044428 A | 11/2015 |
| DE | 3607441 A1 | 9/1987 |

(Continued)

*Primary Examiner* — Hoai-An D. Nguyen
(74) *Attorney, Agent, or Firm* — NGUYEN TARBET LLC

(57) ABSTRACT

The invention relates to an assembly of a T-shaped connector (1) comprising a line input (4), a line output (5) and a measuring socket (2), wherein a measuring device (3), in particular an electrical voltage sensor, is arranged in the measuring socket (2), wherein the measuring device (3) comprises a coupling element (6) for connecting the measuring device (3) to the measuring socket (2), as well as a capacitor assembly with two electrodes (7, 8) located opposite one another, wherein the first electrode (7) is arranged on the coupling element (6) and wherein the second electrode (8) is arranged on an grounding element (9), wherein the measuring socket (2) has a receiving area (10) with a receiving area depth (10') and wherein the measuring device (3) has an insertion area (11) with an insertion area length (11'), wherein the insertion area depth (10') is smaller than or equal to the insertion area length (11'), and wherein the second electrode (8) extends into the insertion area (10) of the measuring socket (2).

10 Claims, 1 Drawing Sheet

(58) Field of Classification Search
USPC .................................................. 324/76.11
See application file for complete search history.

(56) References Cited

FOREIGN PATENT DOCUMENTS

| | | | | |
|---|---|---|---|---|
| DE | 102016112096 A1 | | 1/2018 | |
| EP | 0087267 A1 | | 8/1983 | |
| EP | 0911936 A1 | | 4/1999 | |
| JP | 2013188802 A | * | 9/2013 | ............. B23B 21/00 |
| WO | WO-2012113002 A1 | * | 8/2012 | ........... H01T 13/467 |
| WO | WO2020011620 A1 | | 1/2020 | |

* cited by examiner

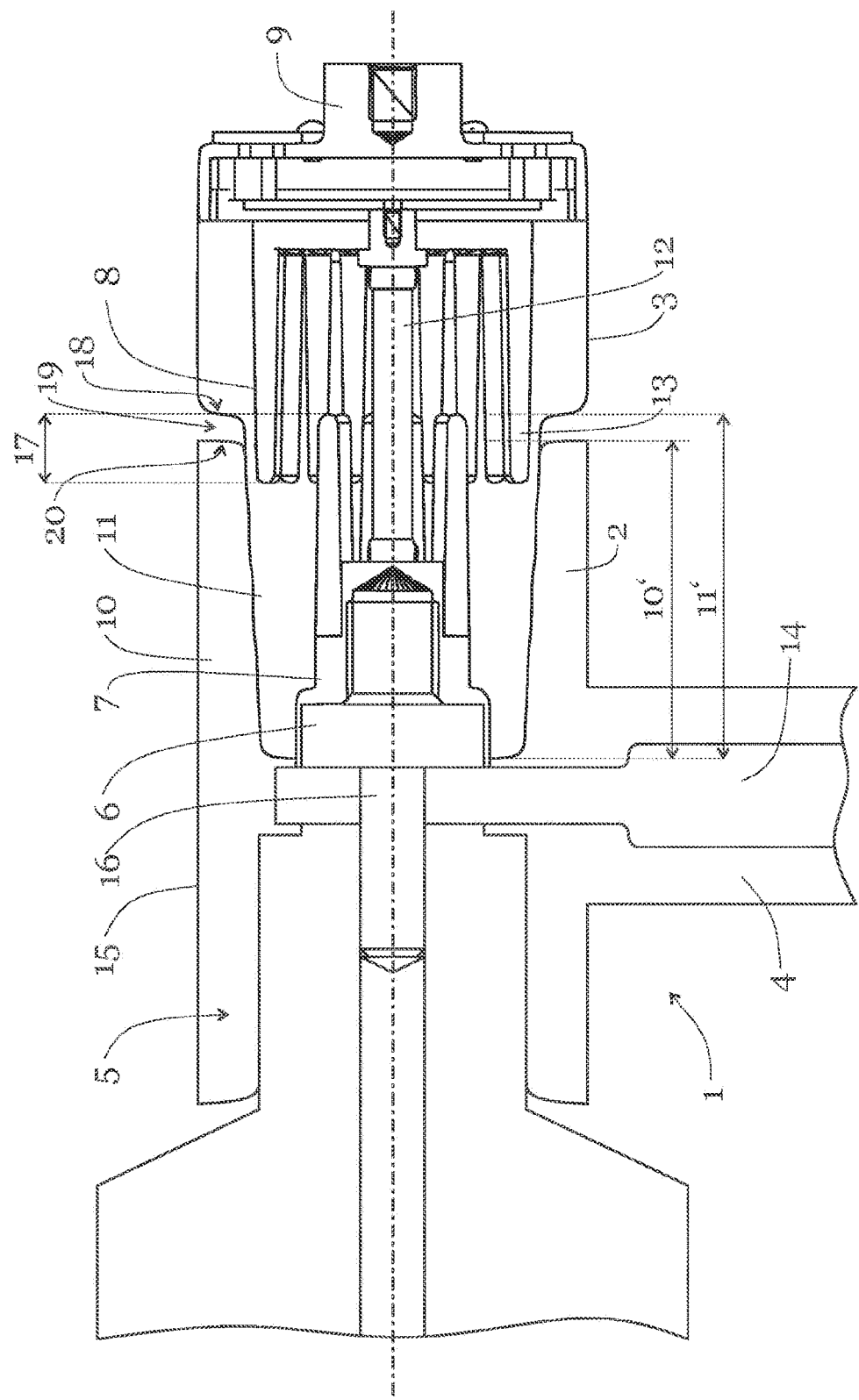

MEASURING DEVICE ASSEMBLY

The present invention relates to an assembly of a T-shaped connector with an electrical measuring device.

Measuring devices such as electrical voltage sensors are used in medium and high voltage electrical power grids to measure and control critical parameters. Usually, so-called T-connectors are used to integrate the measuring devices into the grid, which are located in switch or distribution boxes, for example.

Such T-connectors comprise a line input, a line output as well as a measuring socket. An electrical voltage sensor can be placed in a receiving area of the measuring socket and can be connected to the electrical line running from the line input to the line output. Such T-connectors are known from different prior art documents, for example US 2020/064376 A1, US 2006/022683 A1, DE 36 07 441 A1, EP 0 911 936 A1, CN 105 044 428 A1, DE 10 2016 112096 A1, US 2009/124130 A1, EP 0 087 267 A1, and WO 2020/011620 A1.

Depending on the manufacturer, the measuring sockets of different T-connectors have different geometries, so that an adaptation of the geometry of the measuring device is necessary to allow a precise insertion of the measuring device into the respective measuring socket.

Such measuring sockets are usually designed conically, but the receiving areas have particularly different lengths. If measuring devices are inserted into an unfitting measuring socket, gaps or air-filled areas may occur, favouring voltage flashovers and stray capacitances, resulting in inaccurate measurements.

It was found that such air-filled areas and gaps between the measuring socket and the measuring device lead to problems, in particular with measuring devices that include a capacitive electrode arrangement.

It is therefore an object of the present invention to provide a measuring device that can be used in a flexible manner with connectors of different geometries. A further object in connection therewith is to provide an assembly of a T-shaped connector with a measuring device which minimises the occurrence of interferences, although gaps or air-filled areas may optionally be present between the measuring socket and the measuring device.

The invention relates to an assembly of a T-shaped connector comprising a line input, a line output and a measuring socket, wherein a measuring device, in particular an electrical voltage sensor, is arranged in the measuring socket, wherein the measuring device comprises a coupling element for connecting the measuring device to the measuring socket, as well as a capacitor assembly with two electrodes located opposite one another, wherein the first electrode is arranged on the coupling element and wherein the second electrode is arranged on an grounding element, wherein the measuring socket has a receiving area with a receiving area depth and wherein the measuring device has an insertion area with an insertion area length, wherein the insertion area depth is smaller than or equal to the insertion area length.

According to the invention, it is provided that the second electrode extends into the receiving area of the measuring socket. The inventors have surprisingly found that stray capacitances can be avoided in this way, particularly in cases where a gap is formed between the measuring socket and the measuring device. This gap may be formed in particular by the fact that the receiving area of the measuring socket is too short and thus the corresponding insertion area of the measuring device cannot be fully inserted into the receiving area.

Conventional measuring devices, where the electrode does not protrude into the receiving area, would have the problem in such an assembly that the gap created between the measuring socket and the measuring device would generate a stray capacitance that would influence the measurement in an uncontrollable way.

However, the second electrode protruding into the insertion area bridges this gap and the influence of the gap is reduced or even completely eliminated.

It is therefore advantageous if the insertion area length is large enough to be fully inserted into the measuring sockets of all common connectors.

Optionally, it is provided that the outer surfaces of the receiving area and of the insertion area are designed to be substantially opposite, so that when the measuring device is inserted into the measuring socket, the insertion area rests flush against the receiving area without forming any gaps. A flush fit of the measuring device against the inner surface of the measuring socket is important to avoid the formation of air-filled spaces or areas on the contact surfaces. Optionally, the inner surface of the measuring socket and/or the outer surface of the measuring device may comprise a resilient material to ensure a flush fit and a limited flexibility.

Optionally, it is provided that the receiving area and the insertion area are frustoconically shaped.

Optionally, it is provided that the insertion area has a length from 5 cm to 20 cm, in particular from 10 cm to 15 cm.

Optionally, it is provided that the coupling element is in electrically conductive connection with a line element of the connector. Preferably, the coupling element establishes the connection with the line element to be measured. This connection can be made, for example, by a screw connection or by a plug connection.

Optionally, it is provided that the coupling element is screwed to the connector, in particular to the line element.

Optionally, it is provided that the first electrode and the second electrode are connected to each other in an electrically conductive manner via a resistive element, in particular a resistance element. Such an assembly in combination with a capacitive electrode arrangement is provided in particular for ohmic-capacitive voltage dividers which are used to measure the voltage of current-carrying lines.

It is provided that the electrodes comprise rod-shaped or finger-shaped modulating elements.

It is provided that each electrode comprises a plurality of substantially circularly arranged modulating elements, wherein the modulating elements of the electrodes are arranged concentrically to each other, extend in opposite directions and at least partially overlap, namely preferably in a part of the insertion area which extends beyond the receiving area.

Optionally, it is provided that the second electrode extends at least 0.5 cm, in particular at least 1.0 cm, into the receiving area.

Optionally, it is provided that the connector comprises an electrically insulating housing, wherein the receiving area forms a part of the housing.

Further disclosed is a measuring device for use in an assembly according to the invention. The second electrode of the measuring device preferably extends into the insertion area of the measuring device. Further preferably, the second electrode extends at least 1 cm into the insertion area.

Further features of the invention become apparent from the patent claims, the FIGURE, and the description of the exemplary embodiment.

In the following, the present invention will be discussed in detail with reference to exemplary embodiments.

FIG. 1 shows a schematic sectional view of a assembly in accordance with the invention according to an embodiment of the present invention.

The assembly according to the invention comprises a connector 1, as well as a measuring device 3. The connector 1 is designed as a T-shaped connector 1 and it comprises a line input 4, a line output 5, and a measuring socket 2. Inside the housing 15, which is formed of electrically insulating plastic, a conductive element 14 is arranged, which is connected to an electrical power grid. In the area of the measuring socket 2, the line element 14 has a screw connection 16 for connection to the measuring device 3.

The measuring socket 2 comprises a frustoconical receiving area 10 with a receiving area depth 10' extending substantially from the opening area 20 of the receiving area 10 to the line element 14.

In this embodiment, the measuring device 3 is an ohmic-capacitive voltage divider designed to measure the voltage in the line element 14. The measuring device 3 comprises a first electrode 7 and a second electrode 8. A coupling element 6 is arranged on the first electrode 7, the coupling element being designed for connection to the line element 14. A grounding element 9 is arranged on the second electrode 8, the grounding element serving to connect to a not shown grounding. The measuring signal is tapped on the grounding element 9 side.

The two electrodes 7, 8 comprise finger-shaped modulating elements 13, the modulating elements 13 of each electrode 7, 8 being arranged in a ring shape. The modulating elements 13 of the electrodes 7, 8 have an overlapping area 17 along their longitudinal extension. The electrodes 7, 8 are connected to each other in an electrically conductive manner by a high-ohmic resistance element 12.

The insertion area 11 of the measuring device 3 has a frustoconical surface area with a geometry adapted to the shape of the receiving area 10. In particular, the inclinations of the contact surfaces of the receiving area 10 and the insertion area 11 are adapted to each other in order to ensure a flush abutment and to avoid the formation of cavities.

The insertion area 11 has an insertion area length 11' which extends substantially from the coupling element 6 to a stop in the form of a circumferential widening step 18 at the end of the insertion area 11. The insertion area length 11' is greater than the receiving area depth 10' so that a gap 19 is formed between the opening area 20 of the receiving area 10 and the step 18 of the measuring device 3. Preferably, the insertion area length 11' of the measuring device 3 is adapted so that it is greater than or equal to the respective receiving area depth 10' for different designs of the connector 1, in order to be able to use one design of the measuring device 3 on different connectors 1.

The modulating elements 13 of the second electrode 8 extend into the receiving area 10 of the measuring socket 2, so that the modulating elements 13 of the second electrode 8 bridge the gap 19. This prevents the occurrence of stray capacitances caused by the gap 19.

In this exemplary embodiment, the second electrode 8, in particular its modulating elements 13, extends about 2 cm into the insertion area 11 of the measuring device 3. This allows the second electrode 8 to extend into the receiving area 10 of the measuring socket 2 in most connectors available on the market.

In alternative embodiments not shown, the electrodes 7, 8 may also be plate-shaped or ring-shaped electrodes.

LIST OF REFERENCE SIGNS

1 Connecting piece
2 Measuring socket
3 Measuring device
4 Line input
5 Line output
6 Coupling element
7 First electrode
8 Second electrode
9 Grounding element
10 Receiving area
10' Receiving area depth
11 Insertion area
11' Insertion area length
12 Resistance element
13 Modulating element
14 Line element
15 Housing
16 Screw connection
17 Overlapping area
18 Step
19 Gap
20 Opening area

The invention claimed is:

1. An assembly of a T-shaped connector (1) comprising a line input (4), a line output (5) and a measuring socket (2), wherein a measuring device (3) comprising an electrical voltage sensor, is arranged in the measuring socket (2), wherein the measuring socket (2) has a receiving area (10) with a receiving area depth (10'),
   wherein the measuring device (3) comprises a coupling element (6) for connecting the measuring device (3) to the measuring socket (2), as well as a capacitor assembly with two electrodes (7, 8) facing each other, wherein the first electrode (7) is arranged on the coupling element (6) and wherein the second electrode (8) is arranged on a grounding element (9), and wherein the electrodes (7, 8) comprise rod-shaped or finger-shaped modulating elements (13), and
   wherein the measuring device (3) has an insertion area (11) with an insertion area length (11'),
   wherein the insertion area (11) extends from the coupling element (6) to a peripheral widening step (18),
   wherein the electrodes (7, 8) form an overlapping region (17) which also extends to the widening step (18),
   wherein the receiving area depth (10') is smaller than or equal to the insertion area length (11') of the measuring device (3), and
   wherein the second electrode (8) of the measuring device (3) extends into the receiving area (10) of the measuring socket (2).

2. The assembly according to claim 1, wherein the outer surfaces of the receiving area (10) and of the insertion area (11) are designed to be substantially opposite, so that when the measuring device (3) is inserted into the measuring socket (2), the insertion area (11) rests flush against the receiving area (10) without forming any gaps.

3. The assembly according to claim 2, wherein the receiving area (10) and the insertion area (11) are frustoconically shaped.

4. The assembly according to claim 1, wherein the insertion area (11) has a length from 5 cm to 20 cm.

5. The assembly according to claim 1, wherein the coupling element (6) is in electrically conductive connection with a line element (14) of the connector.

6. The assembly according to claim 1, wherein the coupling element (6) is screwed to the connector (1).

7. The assembly according to claim 1, wherein the first electrode (7) and the second electrode (8) are connected to each other in an electrically conductive manner via a resistive element.

8. The assembly according to claim 1, wherein each electrode (7, 8) comprises a plurality of substantially circularly arranged modulating elements (13), wherein the modulating elements (13) of the electrodes (7, 8) are arranged concentrically to each other, extend in opposite directions and at least partially overlap, namely preferably in a part of the insertion area (11) which extends beyond the receiving area (10).

9. The assembly according to claim 1, wherein the second electrode (8) extends at least 0.5 cm into the receiving area (10).

10. The assembly according to claim 1, wherein the connector (1) comprises an electrically insulating housing (15), the receiving area (10) forming part of the housing (15).

* * * * *